(12) United States Patent
Aranami et al.

(10) Patent No.: US 12,078,673 B1
(45) Date of Patent: Sep. 3, 2024

(54) WORKPIECE POSITIONING MECHANISM AND WORKPIECE INSPECTION APPARATUS

(71) Applicant: TAKAOKA TOKO CO., LTD., Tokyo (JP)

(72) Inventors: Taichi Aranami, Shizuoka (JP); Shohei Suzuki, Shizuoka (JP)

(73) Assignee: TAKAOKA TOKO CO., LTD., Tokyo (JP)

( * ) Notice: Subject to any disclaimer, the term of this patent is extended or adjusted under 35 U.S.C. 154(b) by 0 days.

(21) Appl. No.: 18/648,608

(22) Filed: Apr. 29, 2024

Related U.S. Application Data

(63) Continuation of application No. PCT/JP2023/014898, filed on Apr. 12, 2023.

(51) Int. Cl.
*G01R 31/28* (2006.01)

(52) U.S. Cl.
CPC ..... *G01R 31/2867* (2013.01); *G01R 31/2887* (2013.01); *G01R 31/2889* (2013.01)

(58) Field of Classification Search
CPC .... G01R 31/02; G01R 31/28; G01R 31/2867; G01R 31/2887; G01R 31/2889
See application file for complete search history.

(56) References Cited

U.S. PATENT DOCUMENTS

| | | | |
|---|---|---|---|
| 5,290,134 A | 3/1994 | Baba | |
| 6,445,977 B1 | 9/2002 | Hwang et al. | |
| 2011/0074080 A1 | 3/2011 | Di Stefano et al. | |
| 2011/0260734 A1 | 10/2011 | Liao et al. | |
| 2015/0275346 A1* | 10/2015 | Hatanaka | C21D 9/32 118/724 |
| 2023/0341462 A1* | 10/2023 | Suda | G01R 31/2867 |

FOREIGN PATENT DOCUMENTS

| | | |
|---|---|---|
| JP | H05-079483 U | 10/1993 |
| JP | H06-013415 A | 1/1994 |
| JP | H06-27193 A | 2/1994 |
| JP | H08-054444 A | 2/1996 |
| JP | H08-219726 A | 8/1996 |

(Continued)

OTHER PUBLICATIONS

Notification of Reasons for Refusal issued in Japanese Patent Application No. 2023-545379 mailed on Oct. 10, 2023 with English Translation (8 pages).

(Continued)

*Primary Examiner* — Neel D Shah
(74) *Attorney, Agent, or Firm* — Nakanishi IP Associates, LLC

(57) ABSTRACT

Provided is a workpiece positioning mechanism and a workpiece inspection apparatus, each of which stably maintains precise positional relationship between a tray with a workpiece placed thereon and an inspection device for the workpiece by a simple structure. A workpiece positioning mechanism includes: a tray on which a workpiece is placed; a frame in which a notch defining a height position of the tray positioned in an inspection region is formed; a plurality of pins that are provided on the frame and position the tray; and a bias applier that positions the tray in the inspection region by biasing a bottom surface.

4 Claims, 8 Drawing Sheets

(56) References Cited

FOREIGN PATENT DOCUMENTS

| | | |
|---|---|---|
| JP | H09-97973 A | 4/1997 |
| JP | H09-113580 A | 5/1997 |
| JP | H10-019975 A | 1/1998 |
| JP | 2000-164606 A | 6/2000 |
| JP | 2000-258507 A | 9/2000 |
| JP | 2003-114251 A | 4/2003 |
| JP | 2003-168730 A | 6/2003 |
| JP | 2006-162363 A | 6/2006 |
| JP | 2007-198755 A | 8/2007 |
| JP | 2008-311618 A | 12/2008 |
| JP | 2009-295814 A | 12/2009 |
| JP | 2014-173907 A | 9/2014 |
| JP | 2023-39380 A | 3/2023 |
| KR | 10-2008-0015622 A | 2/2008 |

OTHER PUBLICATIONS

Decision to Grant Patent issued in Japanese Patent Application No. 2023-545379 mailed on Nov. 14, 2023 with English Translation (7 pages).

* cited by examiner

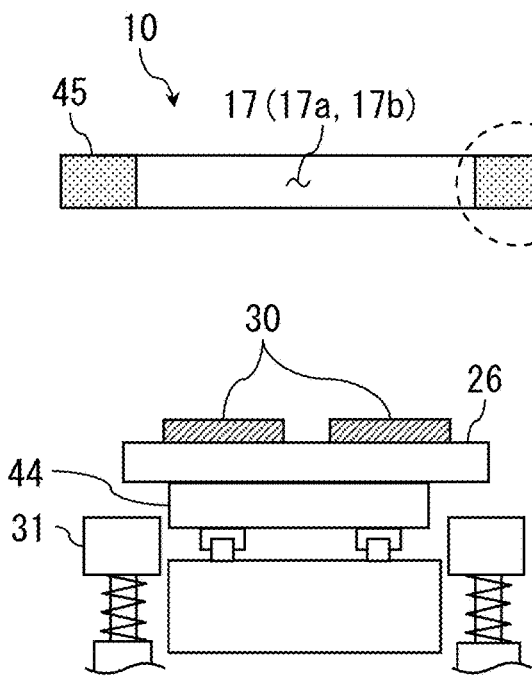 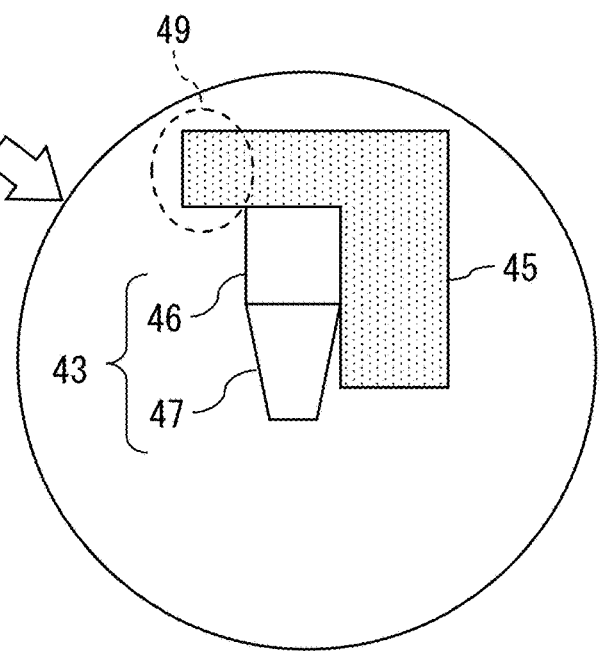
FIG. 2A  FIG. 2B
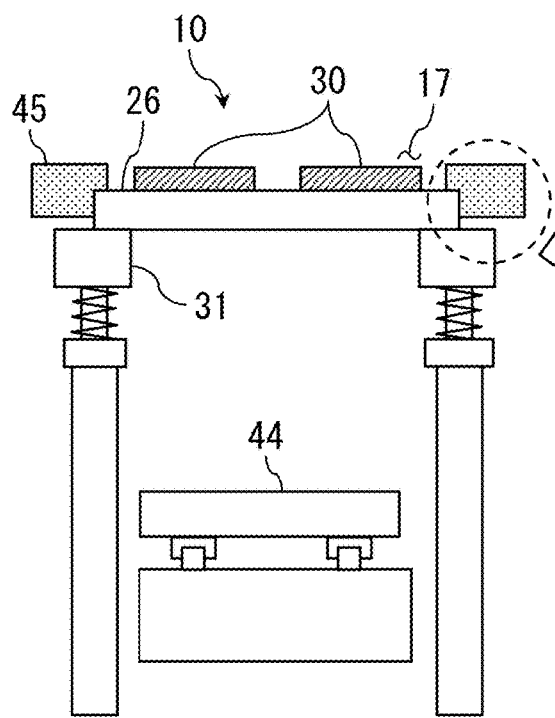 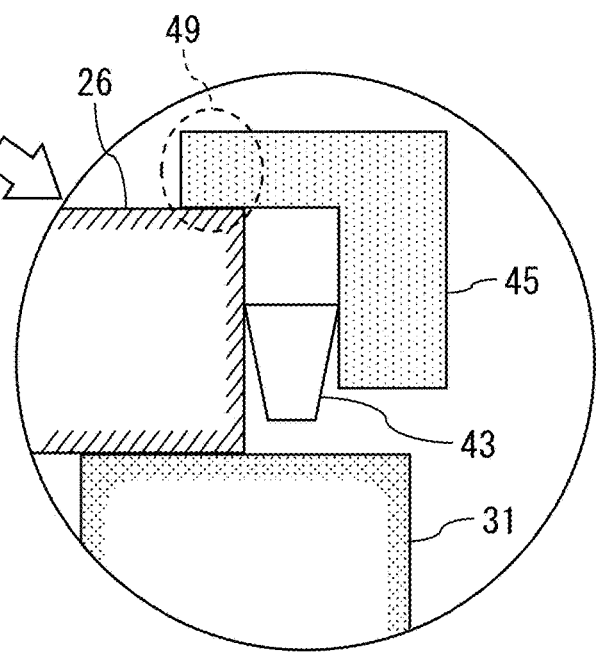
FIG. 3A  FIG. 3B

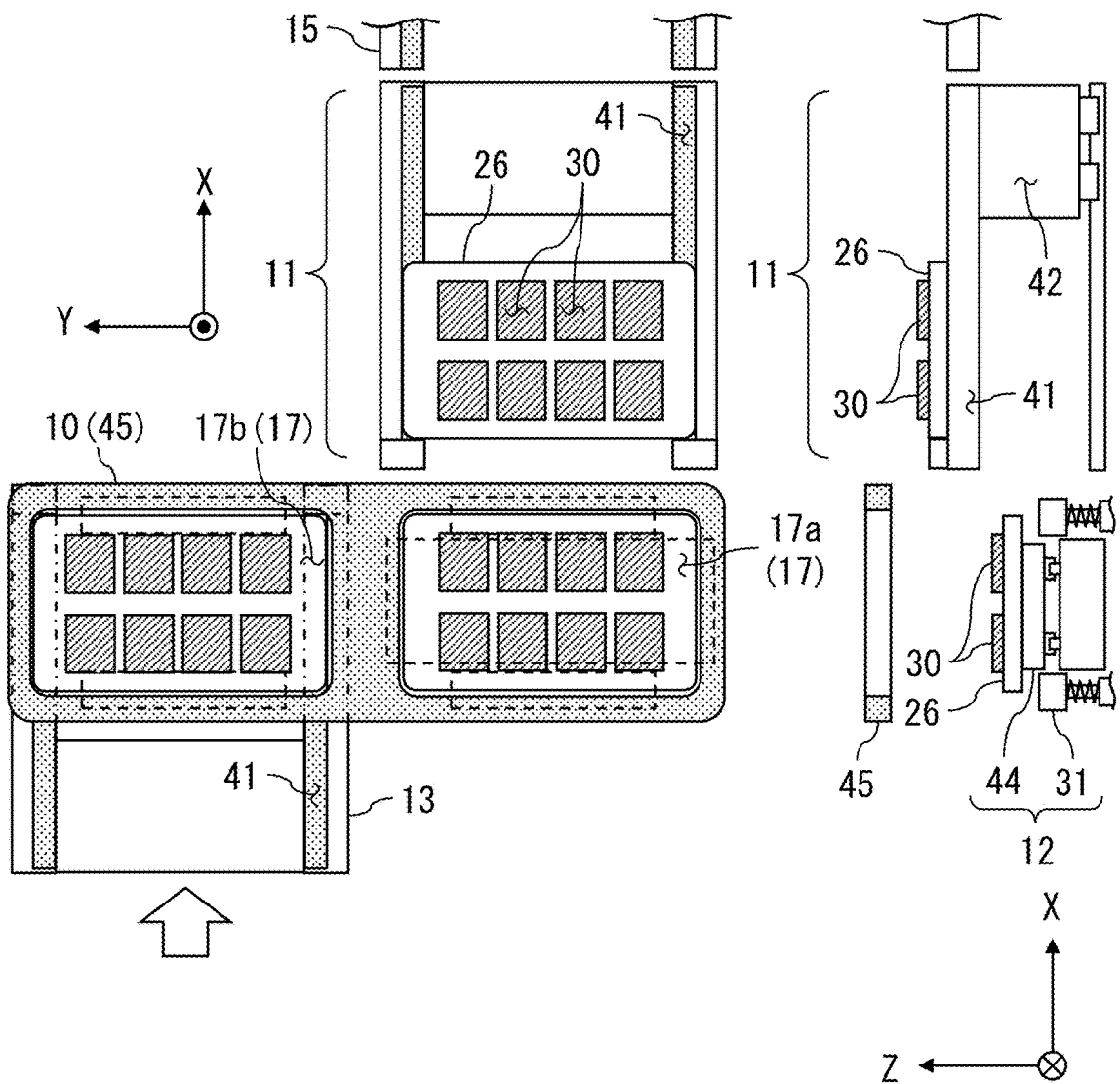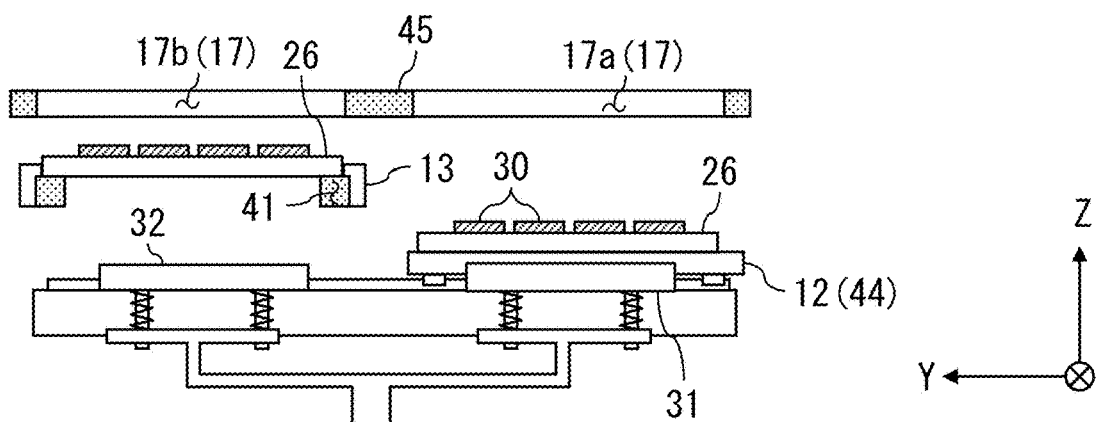
FIG. 5A  FIG. 5B  FIG. 5C

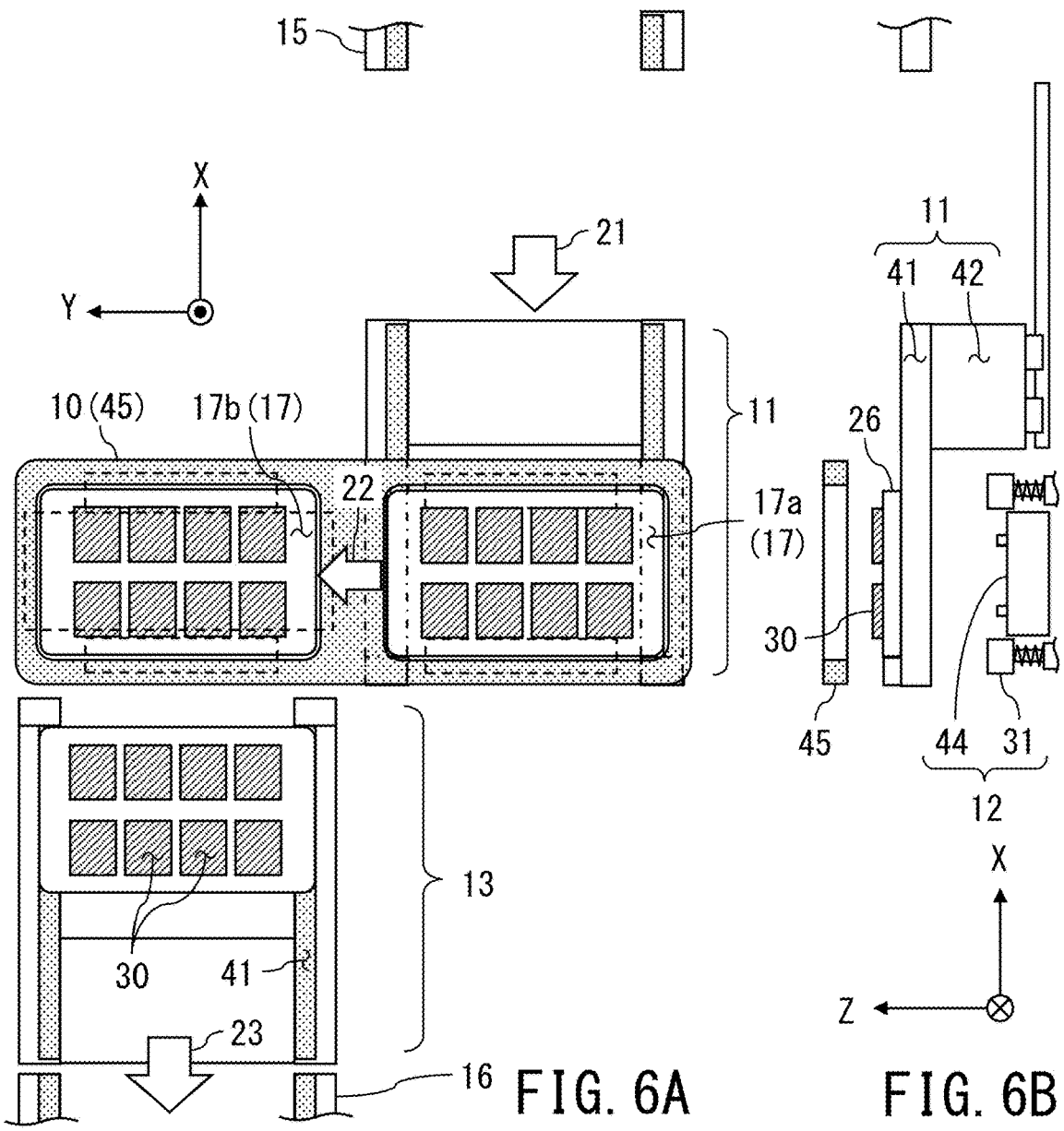
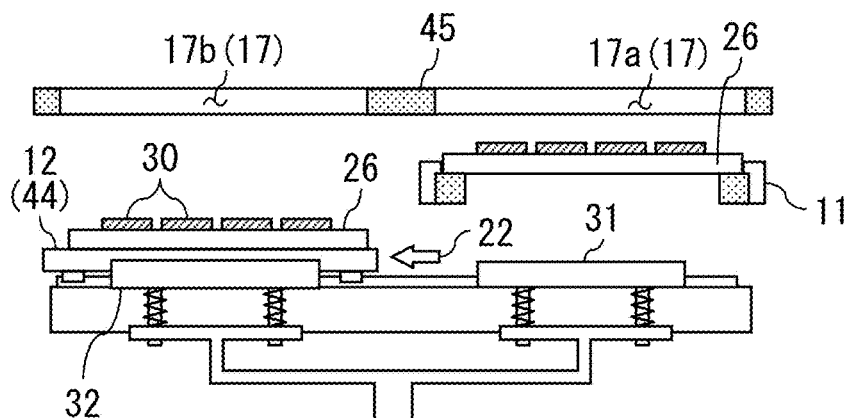
FIG. 6A
FIG. 6B
FIG. 6C

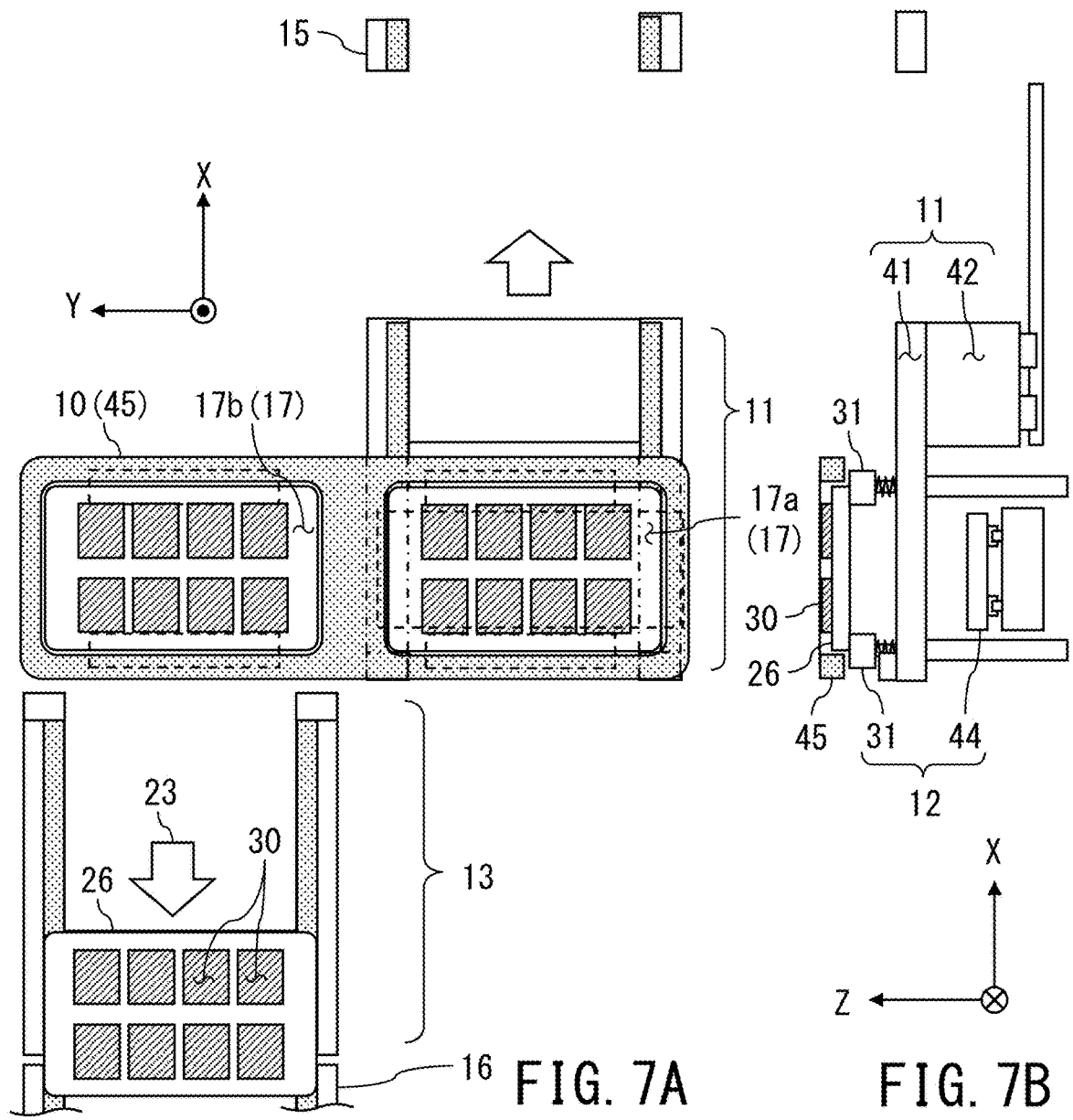
FIG. 7A
FIG. 7B
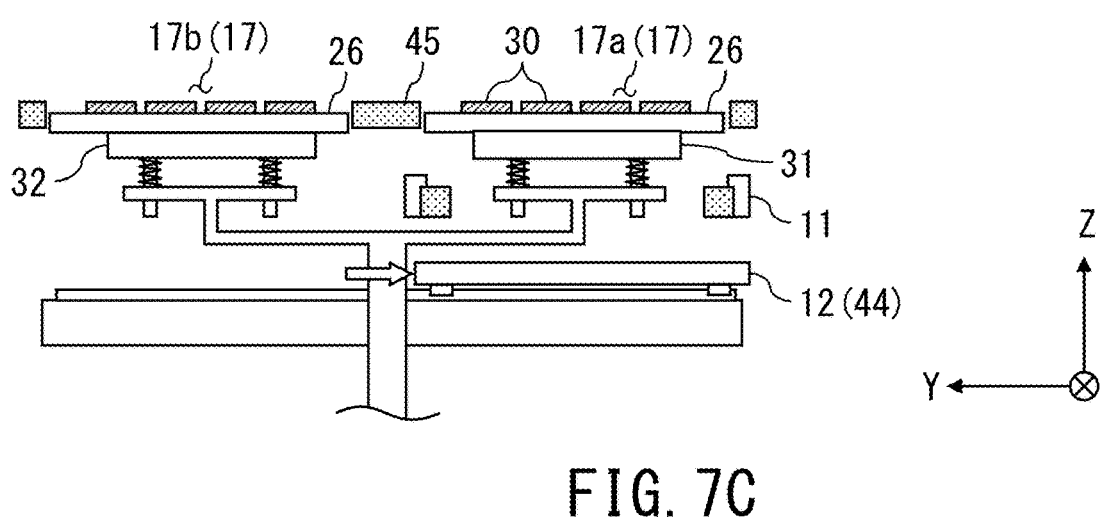
FIG. 7C

US 12,078,673 B1

WORKPIECE POSITIONING MECHANISM AND WORKPIECE INSPECTION APPARATUS

CROSS-REFERENCE TO RELATED APPLICATIONS

This application is a Continuation Application of No. PCT/JP2023/014898, filed on Apr. 12, 2023, the entire contents of which are incorporated herein by reference.

TECHNICAL FIELD

The present invention relates to a workpiece positioning mechanism and a workpiece inspection apparatus, each of which is configured as an in-tray type to inspect workpieces in the state of being placed on a tray.

BACKGROUND

Inspection of semiconductor packages and/or chips after being cut into multiple pieces and separated from a wafer can be roughly classified into the following two methods. The first one is an in-tray method in which a workpiece as an inspection target is inspected in the state of being placed on a tray for placing workpieces thereon (for example, Patent Document 1). The second one is a pick-and-place method in which the workpiece is unloaded from the tray so as to be placed on an inspection table and be inspected and then is loaded onto the tray again after the inspection (for example, Patent Document 2).

PRIOR ART DOCUMENT

Patent Document

[Patent Document 1] JP 2009-295814 A
[Patent Document 2] JP 2003-114251 A

SUMMARY

Problem to be Solved by Invention

The pick-and-place method requires replacement work in which the workpiece to be inspected is loaded onto the tray and unloaded from the tray. Thus, there is a problem that this replacement work takes a lot of time and reduces throughput. The in-tray method can overcome the above-described problem of the pick-and-place method.

In the in-tray method, an inspection region for the workpieces is set in the middle of the tray transport path. In this inspection region, it is difficult to always stably maintain precise positional relationship between each tray to be intermittently transferred and an inspection device for the workpieces.

In view of the above-described circumstances, an object of the present invention is to provide a workpiece positioning mechanism and a workpiece inspection apparatus, each of which stably maintains precise positional relationship between the tray with the workpiece placed thereon and the inspection device for the workpiece by a simple structure.

Solution to Problem

A workpiece positioning mechanism according to the present invention includes: a tray on which a workpiece is placed; a frame in which a notch defining a height position of the tray positioned in an inspection region is formed; a plurality of pins that are provided on the frame and position the tray; and a bias applier that positions the tray in the inspection region by biasing a bottom surface.

Effect of Invention

The present invention provides a workpiece positioning mechanism and a workpiece inspection apparatus, each of which stably maintains precise positional relationship between the tray with a workpiece placed thereon and an inspection device for the workpiece by a simple structure.

BRIEF DESCRIPTION OF DRAWINGS

FIG. 2A is a front view illustrating a state in which a tray is removed from an inspection region by releasing bias to its bottom surface.

FIG. 2B is an enlarged view of the periphery of positioning pin for the tray.

FIG. 3A is a front view illustrating a state in which the bottom surface of the tray is biased and the tray is positioned in the inspection region.

FIG. 3B is an enlarged view of the periphery of the positioning pin for the tray.

FIG. 5A, FIG. 5B, and FIG. 5C are a Y-X top view, a Z-X front view, and a Y-Z side view for illustrating the function of the workpiece positioning mechanism according to the first embodiment, respectively.

FIG. 6A, FIG. 6B, and FIG. 6C are a Y-X top view, a Z-X front view, and a Y-Z side view for illustrating the function of the workpiece positioning mechanism according to the first embodiment, respectively.

FIG. 7A, FIG. 7B, and FIG. 7C are a Y-X top view, a Z-X front view, and a Y-Z side view for illustrating the function of the workpiece positioning mechanism according to the first embodiment, respectively.

DETAILED DESCRIPTION

First Embodiment

Hereinbelow, embodiments of the present invention will be described by using the accompanying drawings.

Figure 1:
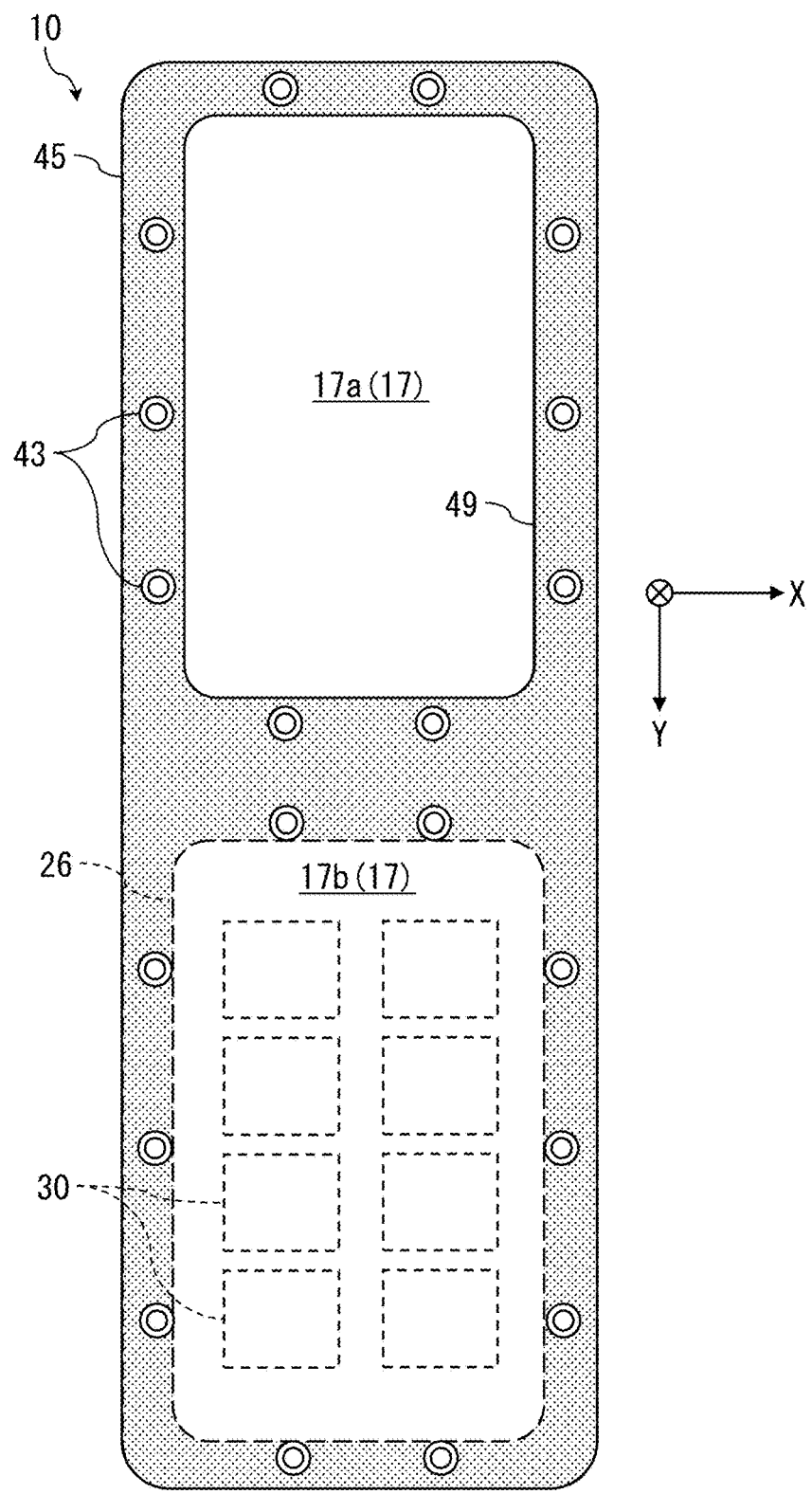
FIG. 1 is an X-Y bottom view of a frame that defines an inspection region in a workpiece positioning mechanism according to the first embodiment of the present invention.

FIG. 1 is an X-Y bottom view of a frame 45 that defines an inspection region 17 in a workpiece positioning mechanism 10 according to the first embodiment of the present invention. Although a description will be given of the embodiment in which both the first inspection region 17a and the second inspection region 17b are provided as the inspection region 17, the inspection region 17 may be only one of both.

The workpiece positioning mechanism 10 includes: a tray 26 on which workpieces 30 are placed; the frame 45 in which a notch 49 defining a height position of the tray 26 positioned in the inspection region 17 (17a and 17b) is formed; a plurality of pins 43 that are provided on the frame 45 and position the tray 26; and a bias applier 31 (FIG. 2A to FIG. 3B) that positions the tray 26 in the inspection region 17 by biasing its bottom surface.

The positioning pins 43 for the tray 26 are arranged so as to surround the outer peripheries of the first inspection region 17a and the second inspection region 17b. The notch 49 defining the height position of the tray 26 does not need to be provided uniformly around the outer periphery of the inspection region 17 (17a and 17b) but may be provided near the positioning pins 43 or may be integrated with the positioning pins 43.

FIG. 2A is a front view illustrating a state in which the tray 26 is removed from the inspection region 17 by releasing the bias to the bottom surface.

FIG. 2B is an enlarged view of the periphery of the positioning pin 43 for the tray 26.

FIG. 3A is a front view illustrating a state in which the bottom surface of the tray 26 is biased and the tray 26 is positioned in the inspection region 17.

FIG. 3B is an enlarged view of the periphery of the positioning pin 43 for the tray 26.

Each pin 43 is composed of a body portion 46 connected to the frame 45 and a tapered portion 47. Of the body portion 46, the side circumferential surface having a constant outer diameter abuts against the periphery of the tray 26 so as to define the planar position of the tray 26. Of the tapered portion 47, the conical surface formed by narrowing the outer diameter from the body portion 46 toward its tip slides into contact with the periphery of the tray 26 so as to guide the tray 26 to the inspection region 17. Since such pins 43 are provided, precise positional relationship between the tray 26 with the workpieces 30 placed thereon and inspection devices 51 and 52 (FIG. 8 and FIG. 9) can be stably maintained by a simple structure.

Figures 4A, 4B:
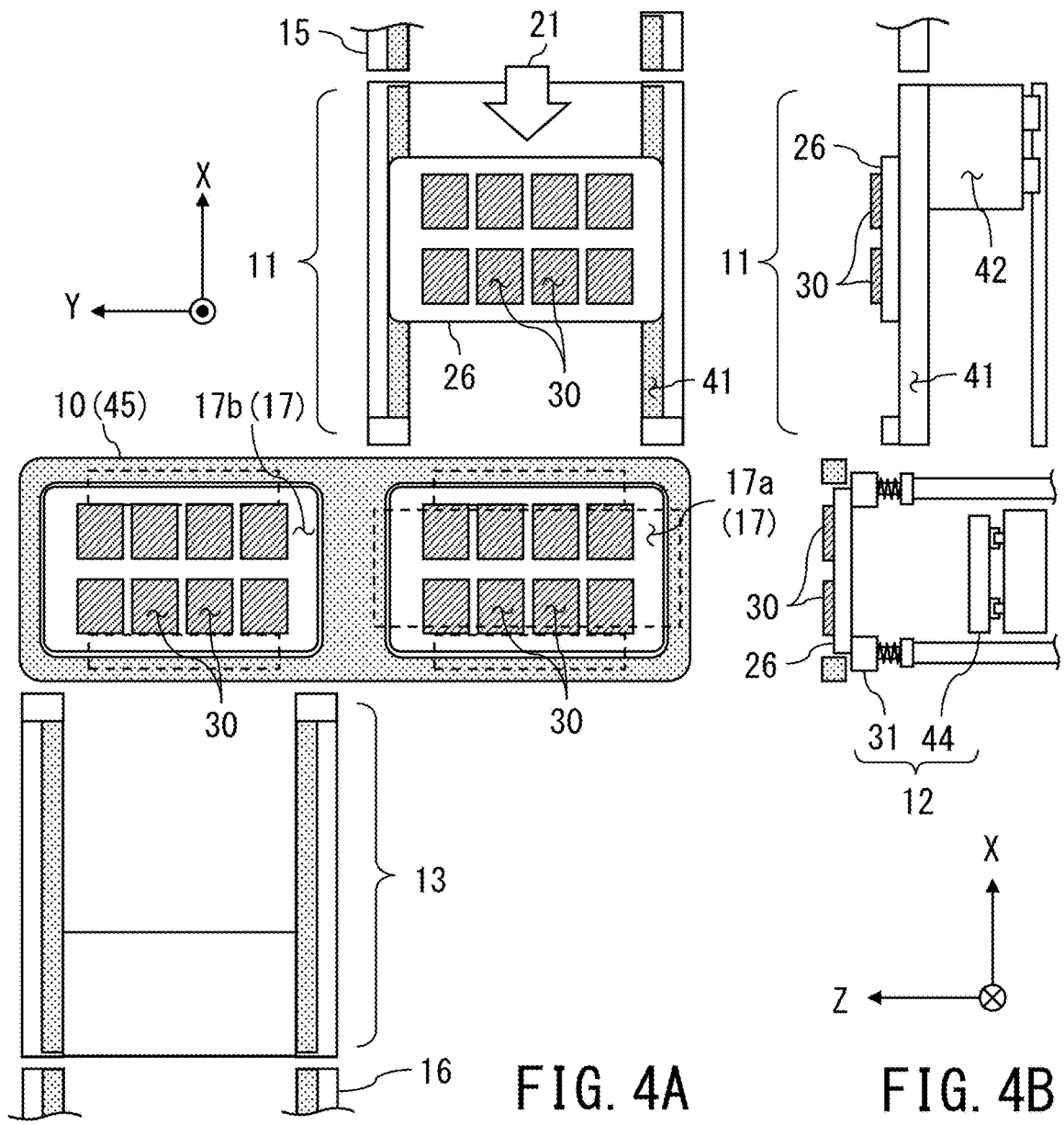
FIG. 4A, FIG. 4B, and FIG. 4C are a Y-X top view, a Z-X front view, and a Y-Z side view for illustrating the function of the workpiece positioning mechanism according to the first embodiment, respectively.

As shown in FIG. 4A, the workpiece positioning mechanism 10 includes peripheral devices composed of: a loader 15 configured to load the tray 26 on which workpieces 30 before inspection are placed; a first transferer 11 configured to guide the loaded tray 26 with the workpieces 30 placed thereon toward the first inspection region 17a by transferring the tray 26 in a first direction 21; a second transferer 12 configured to guide the workpieces 30 toward the second inspection region 17b by transferring the tray 26 in a second direction 22 perpendicular to the first direction 21; a third transferer 13 configured to transfer the tray 26 with the inspected workpieces 30 placed thereon in a third direction 23 perpendicular to the second direction 22; and an unloader 16 configured to unload the tray 26.

Each of FIG. 4A, FIG. 5A, FIG. 6A, and FIG. 7A is a Y-X top view of the workpiece positioning mechanism 10 according to the first embodiment for illustrating its function. Each of FIG. 4B, FIG. 5B, FIG. 6B, and FIG. 7B is a Z-X front view for illustrating the same. Each of FIG. 4C, FIG. 5C, FIG. 6C, and FIG. 7C is a Y-Z side view for illustrating the same.

The first transferer 11 and the third transferer 13 have a common configuration and include: a conveyor 41 configured to transfer the tray 26 from one end to the other end; and a carriage 42 configured to move the conveyor 41 in the direction toward the first inspection region 17a or the second inspection region 17b. The first transferer 11 with the above-described configuration transfers the tray 26, which is loaded from the loader 15 and carries the pre-inspection workpieces 30 placed thereon, in the first direction 21 so as to guide the tray 26 to the first inspection region 17a. The third transferer 13 transfers the tray 26, which carries the post-inspection workpieces 30 placed thereon and has left the second inspection region 17b, in the third direction 23 so as to unload it.

The conveyor 41 is configured by arranging carriers composed of belts, plastic chains, or the like in two rows. The tray 26 with the workpieces 30 two-dimensionally arranged thereon moves in the state of being supported at both ends by the conveyor 41.

The loader 15 and the unloader 16 have a common configuration. The loader 15 loads the tray 26, on which the workpieces 30 before inspection are placed, onto one end of the first transferer 11. The unloader 16 receives the tray 26, on which the workpieces 30 after inspection are placed, from the third transferer 13 and unloads it. Although the loader 15 and the unloader 16 are illustrated as a belt conveyor type, both are not particularly limited to such a type and may be operated manually.

As shown in FIG. 7A to FIG. 7C, the second transferer 12 includes: a first bias applier 31 configured to position the tray 26 from the first transferer 11 to the first inspection region 17a by biasing the bottom surface; a mover 44 configured to load the tray 26 released from the bias onto itself and guide the tray 26 from the first inspection region 17a to the second inspection region 17b; and a second bias applier 32 configured to position the tray 26 from the mover 44 to the second inspection region 17b by biasing the bottom surface. As shown in FIG. 4C, FIG. 5C, FIG. 6C, and FIG. 7C, the first bias applier 31 and the second bias applier 32 are synchronized in timing of applying and releasing the bias with respect to each of the corresponding trays 26.

In addition to that the second transferer 12 loads the tray 26 onto itself and transfers the tray 26 in the second direction 22 from the first inspection region 17a to the second inspection region 17b, the second transferer 12 is returned in the state of being empty in the direction from the second inspection region 17b toward the first inspection region 17a, i.e., in the direction opposite to the second direction 22. On the upper side of the second transferer 12, the frame 45 partitioning the first inspection region 17a and the second inspection region 17b is provided.

Figure 8:
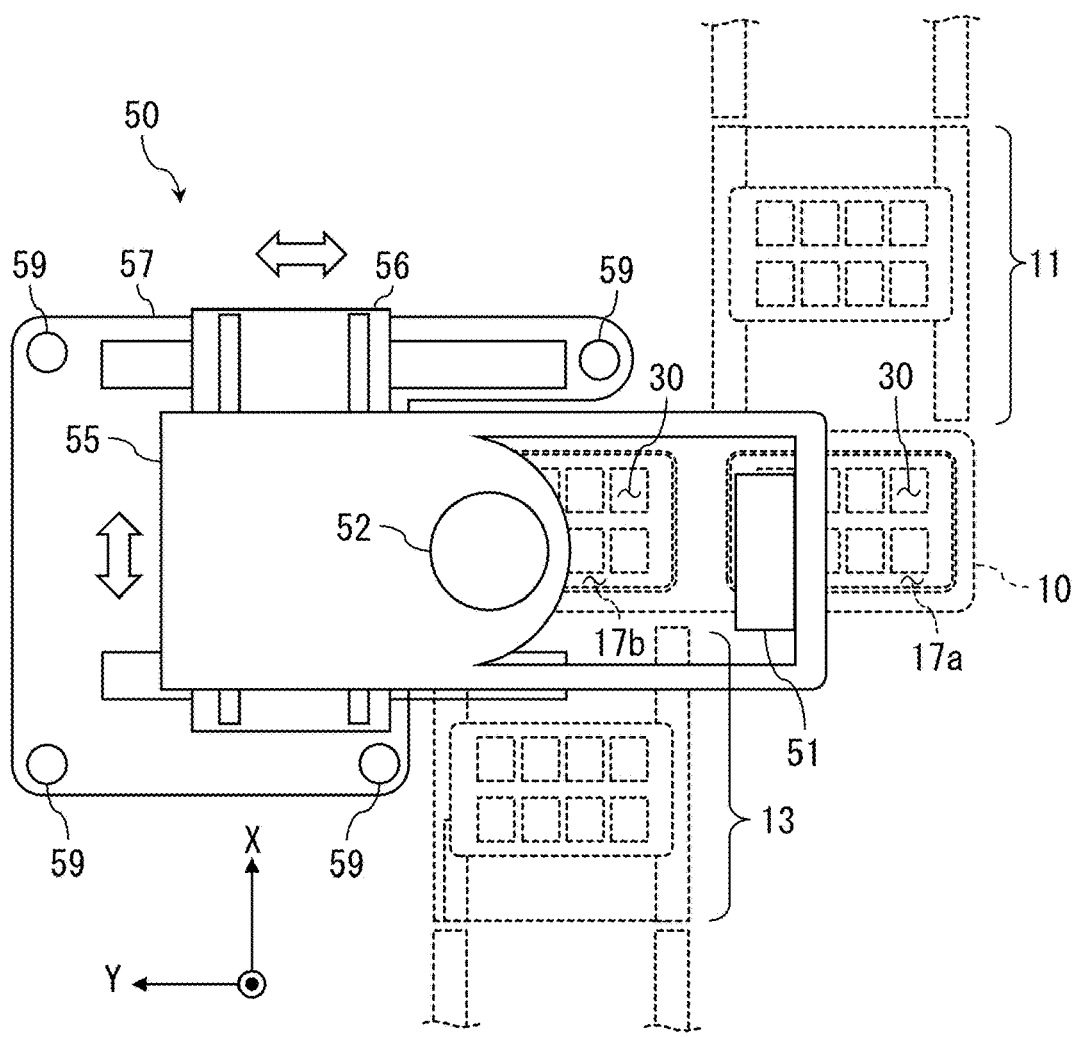
FIG. 8 is a Y-Z top view of a workpiece inspection apparatus according to the second embodiment of the present invention.
Figure 9:
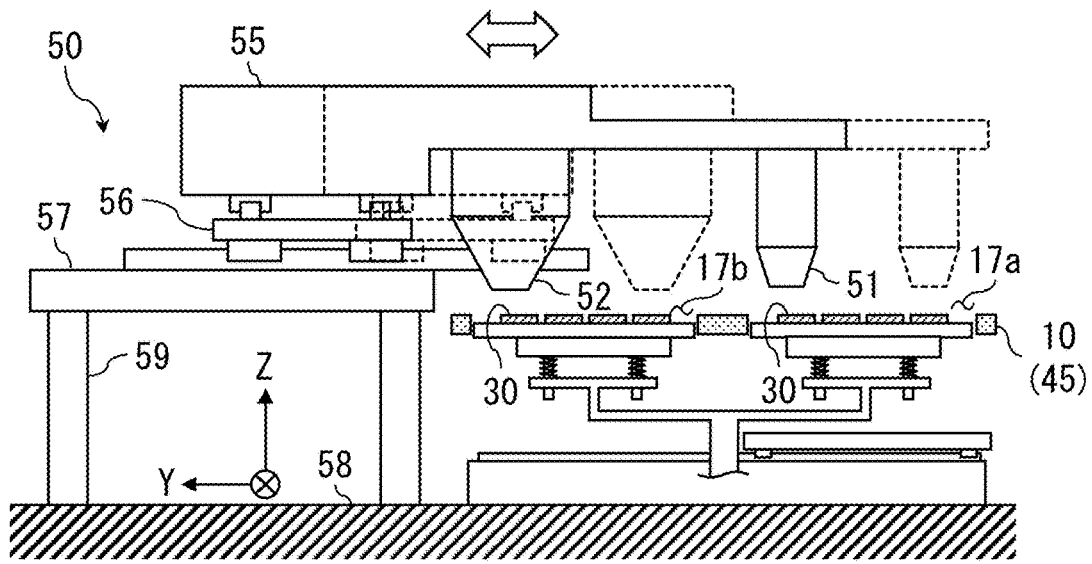
FIG. 9 is a Y-Z side view of the workpiece inspection apparatus according to the second embodiment of the present invention.

FIG. 8 is a Y-X top view of a workpiece inspection apparatus 50 according to the second embodiment of the present invention. FIG. 9 is a Y-Z side view of this workpiece inspection apparatus 50.

The workpiece inspection apparatus 50 includes: a first inspection device 51 that inspects the workpieces 30 in the first inspection region 17a; a second inspection device 52 that inspects the workpieces 30 in the second inspection region 17b; a housing 55 that accommodates the first inspection device 51 and the second inspection device 52 at the same arrangement interval as the arrangement interval between the first inspection region 17a and the second inspection region 17b; a stage 56 that displaces the housing 55 by the same interval as the arrangement interval between the workpieces 30 on the tray 26; and a supporting body 57 that supports this stage 56 and is fixed to the floor surface 58.

Although the workpiece inspection apparatus 50 according to the embodiment adopts a floor-surface fixing method in which the supporting body 57 of the stage 56 is fixed to the floor surface 58, the workpiece inspection apparatus 50 may adopt a hanging method in which the stage 56 is fixed to a ceiling surface. Although a description has been given of the case where a plurality of inspection regions composed of the first inspection region 17a and the second inspection region 17b are provided, there may be cases where only one inspection region 17 is provided.

Returning to FIG. 4A to FIG. 7C, a description will be given of the function of the workpiece positioning mechanism 10 and the operation of the workpiece inspection apparatus 50.

Figure 4C:
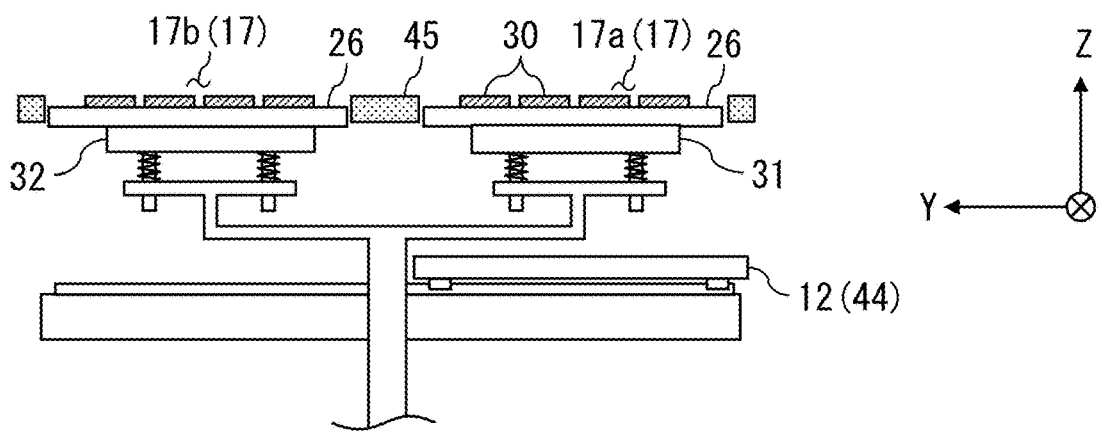

First, as shown in FIG. 4A to FIG. 4C, in the first inspection region 17a and the second inspection region 17b, the first inspection device 51 and the second inspection device 52 (FIG. 8 and FIG. 9) are displaced by the same interval as the arrangement interval between the workpieces 30 such that the workpieces 30 are inspected. At this time, the second transferer 12 raises the bias appliers 31 and 32 so as to bias and position the trays 26 with respect to the first inspection region 17a and the second inspection region 17b. At this time, the precise positional relationship between the trays 26 and the inspection devices 51 and 52 is stably maintained by the effect of the plurality of pins 43 (FIG. 1).

Further, another tray 26 with the pre-inspection workpieces 30 placed thereon is loaded by the loader 15 onto one end of the first transferer 11, and then, the first transferer 11 causes the conveyor 41 to transfer this tray 26 from one end to the other end. At the other end of the first transferer 11, this tray 26 is kept in a standby state until the inspection of the trays 26 in the inspection region 17 is completed.

Next, as shown in FIG. 5A to FIG. 5C, at the time when (or by the time when) the inspection for the trays 26 in the inspection region 17 is completed, the third transferer 13 is moved in the direction opposite to the third direction 23 such that the empty conveyor 41 is positioned below the second inspection region 17b. Further, the bias appliers 31 and 32 are lowered to release the bias, and the trays 26 are removed from the inspection region 17 (17a and 17b), and thereby, the tray 26 in the first inspection region 17a is placed on the mover 44 whereas the tray 26 in the second inspection region 17b is placed on the conveyor 41 of the third transferer 13. At this time as well, the trays 26 are stably removed from the inspection region 17 by the effect of the plurality of pins 43 (FIG. 1).

Next, as shown in FIG. 6A to FIG. 6C, the third transferer 13 is moved in the third direction 23 so as to be brought closer to the unloader 16. At the same time with this, the mover 44 moves in the second direction 22 from directly below the first inspection region 17a and transfers the loaded tray 26 to the position immediately below the second inspection region 17b. Furthermore, at the same time with this, the first transferer 11 is moved in the first direction 21, and the conveyor 41 carrying the tray 26 with the pre-inspection workpieces 30 placed thereon is positioned below the first inspection region 17a. These three actions are performed simultaneously, and the state shown in FIG. 5A to FIG. 5C changes instantaneously to the state shown in FIG. 6A to FIG. 6C.

Next, as shown in FIG. 7A to FIG. 7C, in the second transferer 12, the bias appliers 31 and 32 are raised to bias and position the trays 26 with respect to the first inspection region 17a and the second inspection region 17b. At this time, due to the effect of the positioning pins 43 (FIG. 2A to FIG. 3B), the trays 26 are accurately and stably fixed in term of height position and planar position with respect to the respective first and second inspection regions 17a and 17b.

Next, the first transferer 11 is moved in the direction opposite to the first direction 21 so as to bring the empty conveyor 41 closer to the loader 15. At the same time with this, the mover 44 in the second transferer 12 moves in the empty state from the second inspection region 17b in the direction opposite to the second direction 22 (FIG. 6A to FIG. 6C), and returns to the position of the first inspection region 17a. The third transferer 13 operates the conveyor 41 so as to transfer the tray 26, which carries the post-inspection workpieces 30 placed thereon and has left the second inspection region 17b, in the third direction 23 and unload the tray 26. These three actions are performed simultaneously, and the state shown in FIG. 7A to FIG. 7C changes instantaneously to the state shown in FIG. 4A to FIG. 4C. In this manner, the operation described on the basis of FIG. 4A to FIG. 7C is repeated, and thereby, the trays 26 with the uninspected workpieces 30 placed thereon are sequentially loaded, inspected, and unloaded.

Figure 10A:
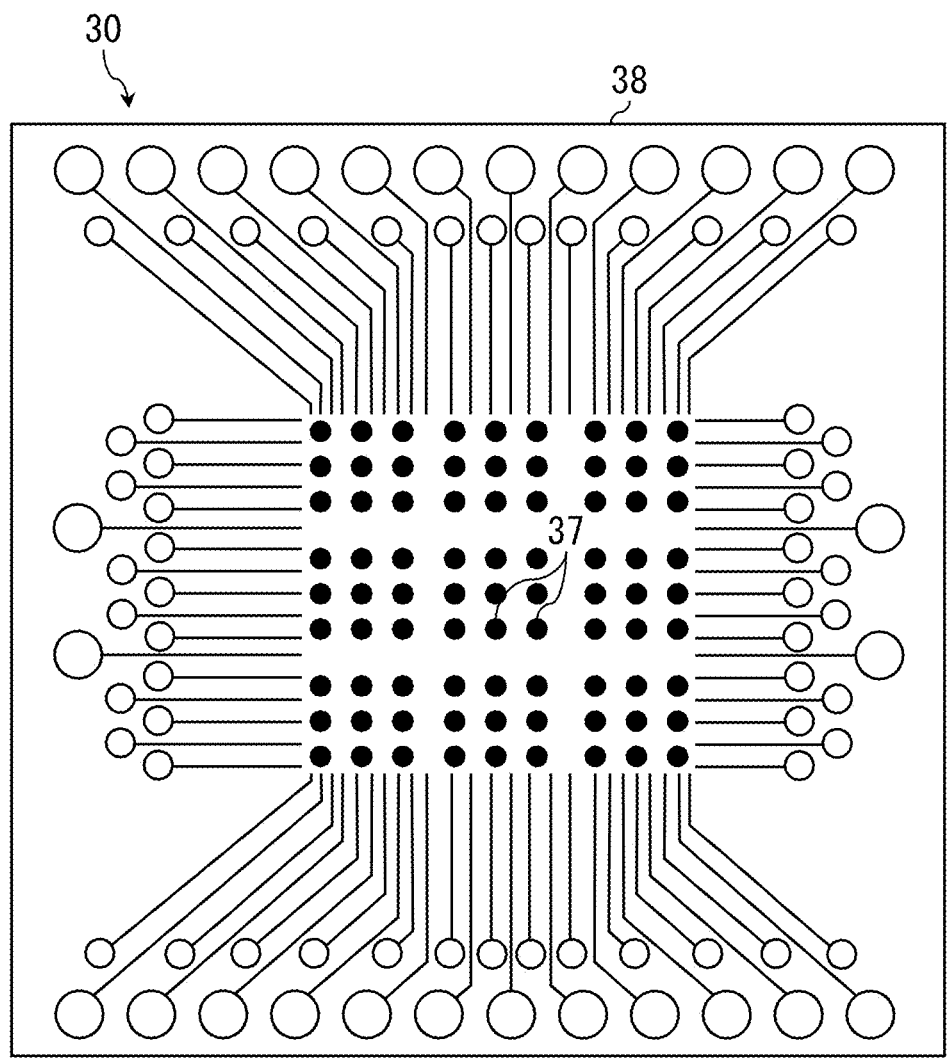
FIG. 10A is a top transparent view of a multi-layer wiring substrate, which is to be applied as a workpiece of the present embodiment and has bumps arrayed on its top surface.
Figure 10B:
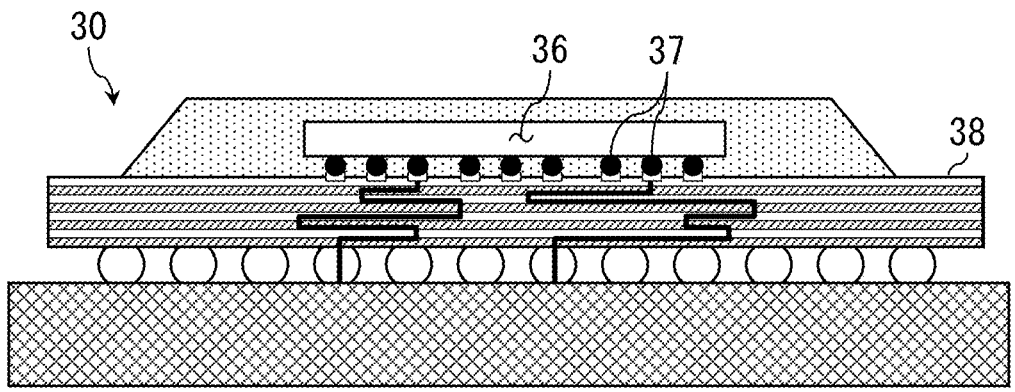
FIG. 10B is a side transparent view of an LSI package in which an LSI chip is mounted on the multi-layer wiring substrate.

FIG. 10A is a top transparent view of a multi-layer wiring substrate 38, which is to be applied as a workpiece 30 of the present embodiment and has bumps 37 arrayed on its top surface. FIG. 10B is a side transparent view of an LSI package in which an LSI chip 36 is mounted on the multi-layer wiring substrate 38. In this LSI package, electrodes of the multi-layer wiring substrate 38 and electrodes of the LSI chip 36 are electrically connected by the bumps 37. Further, the LSI package is packaged with resin as a countermeasure against deterioration and heat. This method of electrical connection using the ball-shaped bumps 37 is referred to as flip-chip packaging.

In the flip-chip packaging, the respective bumps 37 are required to be of equal height in order to directly overlap the electrodes of the multi-layer wiring substrate 38 and the electrodes of the LSI chip 36 with each other. This is because a connection failure occurs if there is variation in height of the bumps 37. Aside from that, it is required to detect defects such as bump positions, bump diameter, other bump shape abnormality, and foreign matters on the substrate. Although the workpiece 30 is illustrated as an LSI package in the embodiment, the workpiece 30 is not limited to this. It is applicable as long as the workpiece 30 can be placed on the tray 26.

In this case, the first inspection device 51 measures the relative height of the multi-layer wiring substrate 38, and the second inspection device 52 is a measurement/inspection device that measures various dimensions of the bumps 37 arranged on the top surface of the multi-layer wiring substrate 38 and detects foreign matters. Specifically, it is a measurement/inspection instrument that has an image measuring instrument and a surface-profile measuring instrument using light or functions of both and can measure surface unevenness information.

In general, variation in the top-surface height of the multi-layer wiring substrate 38 is much larger than the variation in the size of the bumps 37. For this reason, the measurement range of the first inspection device 51 is set to be much larger than that of the second inspection device 52. Hence, an adjustment mechanism (not shown) configured to adjust the height direction of the frame 45 is provided in such a manner that the second inspection region 17b does not deviate from the measurement range of the second inspection device 52. The inspection devices 51 and 52 are not limited to a specific type. Any device configured to inspect the workpieces 30 can be appropriately adopted as the inspection device 51 or 52 regardless of whether it is a contact type or a non-contact type.

The invention claimed is:

1. A workpiece positioning mechanism comprising:
   a tray on which a workpiece is placed;
   a frame in which a notch defining a height position of the tray positioned in an inspection region is formed;
   a plurality of pins that are provided on the frame and position the tray; and
   a bias applier that positions the tray in the inspection region by biasing a bottom surface,
   wherein each of the plurality of pins is composed of:
      a body portion that is connected to the frame, has a side circumferential surface having a constant outer diameter, and defines a planar position of the tray by abutting against a periphery of the tray with the side circumferential surface; and
      a tapered portion that has a conical surface formed by narrowing an outer diameter from the body portion toward a tip and guides the tray to the inspection region by making the conical surface slide into contact with the periphery of the tray.

2. The workpiece positioning mechanism according to claim 1, further comprising a mover on which the tray released from bias is placed, wherein:
   the inspection region is composed of a first inspection region and a second inspection region that are adjacent to each other; and
   the mover is configured to guide the tray from the first inspection region to the second inspection region.

3. A workpiece inspection apparatus comprising:
   the workpiece positioning mechanism according to claim 1;
   an inspection device that inspects the workpiece in the inspection region;
   a housing that accommodates the inspection device; and
   a stage that displaces the housing by a same interval as an arrangement interval between workpieces on the tray.

4. A workpiece inspection apparatus comprising:
   the workpiece positioning mechanism according to claim 2;
   a first inspection device that inspects the workpiece in the first inspection region;
   a second inspection device that inspects the workpiece in the second inspection region;
   a housing that accommodates the first inspection device and the second inspection device at a same arrangement interval as an arrangement interval between the first inspection region and the second inspection region; and
   a stage that displaces the housing by a same interval as an arrangement interval between workpieces on the tray.

\* \* \* \* \*